US008432154B2

(12) United States Patent
Lund

(10) Patent No.: US 8,432,154 B2
(45) Date of Patent: Apr. 30, 2013

(54) MULTIMETER HAVING COMMUNICATIONS VIA MEASUREMENT TERMINALS AND COMMUNICATION SYSTEM FOR SAME

(75) Inventor: John Lund, Marysville, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 13/116,689

(22) Filed: May 26, 2011

(65) Prior Publication Data

US 2011/0221423 A1 Sep. 15, 2011

Related U.S. Application Data

(62) Division of application No. 12/098,289, filed on Apr. 4, 2008, now Pat. No. 7,960,965.

(51) Int. Cl.
*G01R 17/06* (2006.01)
(52) U.S. Cl.
USPC .......................................... 324/99 D; 324/115
(58) Field of Classification Search .................. None
See application file for complete search history.

(56) References Cited

U.S. PATENT DOCUMENTS

| 4,608,532 | A | 8/1986 | Ibar |
| 5,396,168 | A * | 3/1995 | Heep et al. ..................... 324/115 |
| 5,489,841 | A | 2/1996 | Henkelmann |
| 5,581,175 | A | 12/1996 | Yoneyama |
| 6,098,095 | A * | 8/2000 | Nelson et al. ................. 709/208 |
| 6,512,705 | B1 | 1/2003 | Koelling |
| 2002/0153903 | A1 | 10/2002 | Murtishaw |
| 2006/0161396 | A1 * | 7/2006 | Kagan ........................... 702/185 |
| 2006/0195843 | A1 | 8/2006 | Hall |

* cited by examiner

*Primary Examiner* — Arleen M Vazquez
(74) *Attorney, Agent, or Firm* — Christensen O'Connor Johnson Kindness PLLC

(57) ABSTRACT

A multimeter having measurement terminals and configured to receive measurement signals applied to the measurement terminals and a measurement value and also configured to receive communication signals applied to the measurement terminals and extract encoded information from the communication signals. The multimeter can be included in a multimeter communication system having a device coupled to the measurement terminals of the multimeter. The device is configured to generate communication signals having encoded information and provide the communication signals to the measurement terminals of the multimeter.

13 Claims, 8 Drawing Sheets

US 8,432,154 B2

MULTIMETER HAVING COMMUNICATIONS VIA MEASUREMENT TERMINALS AND COMMUNICATION SYSTEM FOR SAME

CROSS-REFERENCE TO RELATED APPLICATION

This application is a divisional of U.S. patent application Ser. No. 12/098,289, filed Apr. 4, 2008, the disclosure of which is incorporated by reference herein.

BACKGROUND

There have been many approaches taken in providing electronic communications with a multimeter. One such approach is including a dedicated communication ports and supporting circuitry in the multimeter for the purpose of communicating with another device. For example, these multimeters have terminals for GPIB (general purpose instrument bus), USB (universal serial bus) or LAN (local area network) interface. A user connects the appropriate connector to the communication terminal on the multimeter and the other device to allow communication between the two. Another approach to providing communications with a multimeter is to include a wireless interface and supporting circuitry that are used for communications. For example, these multimeters include infrared or radio frequency communication interfaces. Communication between the multimeter and the device can occur when the two are placed within range of one another.

Although the previously described approaches provide the multimeter with the ability to communicate with external devices, there are considerations to be made. In the case of including dedicated communication ports in the multimeter, there are additional manufacturing costs involved with building such a multimeter. Another consideration is compromising durability of the multimeter and its resistance to the elements because the port represents another physical element of the multimeter that can fail and the opening can expose internal components of the multimeter to the elements. As for including wireless communication interfaces, there are added costs associated with materials and manufacturing. Moreover, battery life for a multimeter can be decreased due to the added power consumption from communicating through a wireless interface.

Therefore, there is a need for an alternative solution to communicating with a multimeter.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
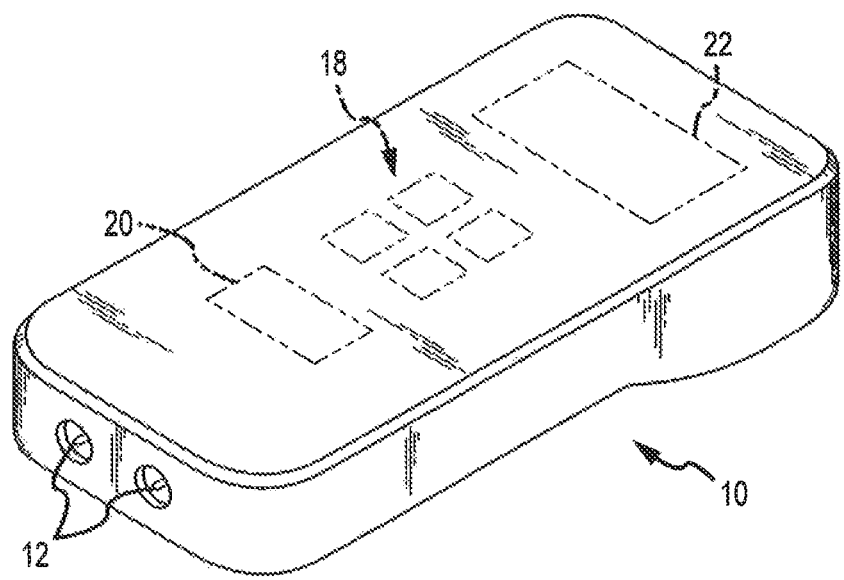
FIG. 1 is a drawing of a handheld multimeter.

FIG. 1 illustrates a multimeter 10 having a key pad 18 is provided for entry of information to the multimeter. The multimeter 10 further includes a function selector 20 that allows an operator to choose various meter functions, for example, selecting a measurement function of the multimeter 10. A display 22 is included for providing visual information to an operator, such as a measurement value. The multimeter further includes measurement terminals 12 to which test leads (not illustrated) connect for coupling the measurement terminals 12 to a device under test. For example, a pair of test leads coupled to the measurement terminals can be used to measure a voltage by coupling the voltage to the measurement terminals though the test leads. The multimeter measures the voltage coupled to the measurement terminals and displays the measured value on the display 22.

Figure 2:
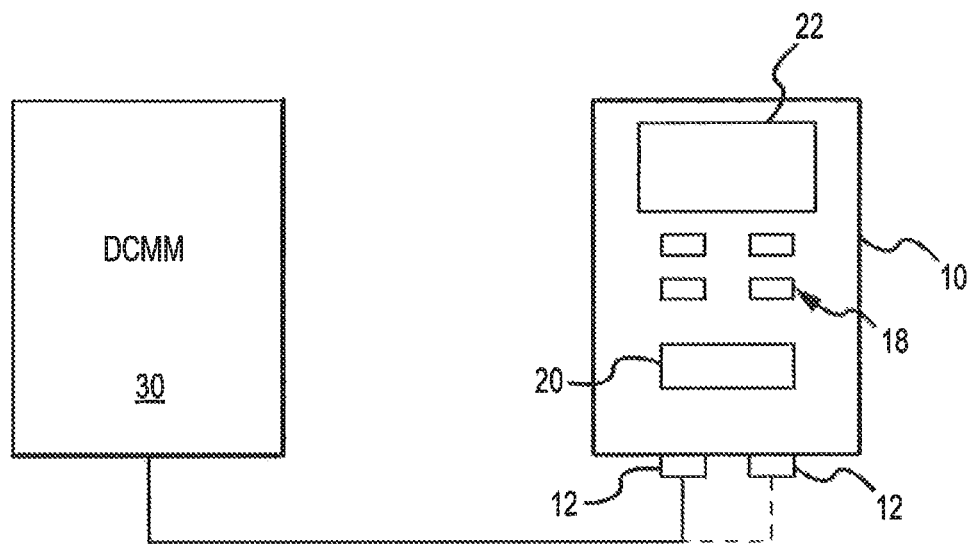
FIG. 2 is simplified block diagram of a multimeter communication system according to an embodiment of the invention.

FIG. 2 illustrates a multimeter communication system according to an embodiment of the present invention. A device communicating with the multimeter ("DCMM") 30 is coupled to measurement terminals 12 of the multimeter 10. As will be described in more detail below, the DCMM 30 and the multimeter 10 can communicate information with each other by way of communication signals provided through the measurement terminals 12. In contrast to conventional multimeter communication systems, the multimeter 10 does not communicate with the DCMM 30 through a dedicated communication port. In one embodiment, the communication signals represent digitally encoded information. Although FIG. 2 illustrates a pair of measurement terminals 12 through which communications occur, other embodiments of the invention include a greater or fewer number of measurement terminals through which communications can occur. Thus, it will be appreciated by those ordinarily skilled in the art the scope of the invention is not limited by the specific number of measurement terminals of a particular embodiment.

Figure 3:
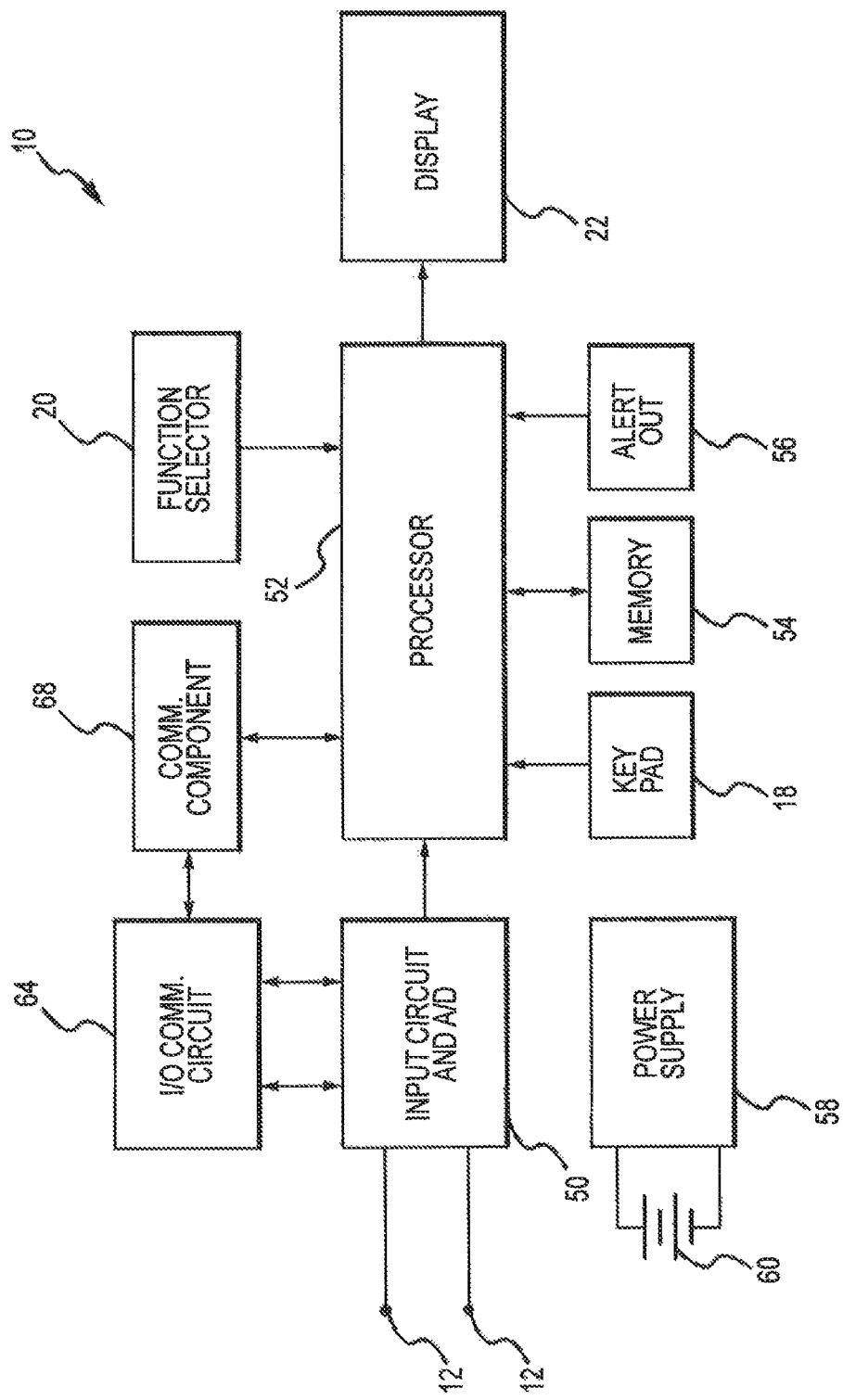
FIG. 3 is a simplified block diagram of a portion of the multimeter of FIG. 2 according to an embodiment of the invention.

FIG. 3 illustrates a portion of the multimeter 10 according to an embodiment of the present invention. The measurement terminals 12 are coupled to an input circuit and A/D converter 50 that receives signals applied to the measurement terminals 12. The input circuit and A/D converter 50 can include protection circuitry that prevents damage to components of the multimeter 10 that may occur when signals are applied to the measurement terminals 12, such as when high voltage and/or high current signals are accidentally applied during measurement of electrical characteristics. The input circuit and A/D converter 50 also generates a digital representation of the analog measurement signal presented at the measurement terminals 12. A processor 52 receives the digital output of the converter 50 for processing and calculates a measurement value. A memory 54, representing non-volatile and/or volatile memory, is coupled to the processor 52 to store digital information accessible by the processor 52. The processor 52 also receives input from keypad 18 as well as from function selector 20, which are operative to control various functions of the multimeter. Processor 52 supplies data to alert output module 56 for generating an alert signal, for example, an audible tone, during operation. The processor 52 further supplies display data to display 22 in order to provide visual readout of measurement values and times. Power supply 58 including battery 60 supplies power to the various circuits of the multimeter 10. In operation, the multimeter 10 performs measurements on a programmed, cyclical basis, periodically sampling measurement signals at the measurement terminals and converting them from analog to digital form for processing and display.

The multimeter 10 of FIG. 3 further includes an input/output communication circuit 64 coupled to the input circuit and A/D converter 50 to receive signals applied to the measurement terminals 12. The I/O communication circuit 64 detects input communication signals applied to the terminals 12 by a DCMM (FIG. 2) and generates corresponding internal communication signals provided to a communication component 68 also coupled to the processor 52. The I/O communication circuit 64 further receives internal communication signals from the communication component 68 and generates output communication signals transmitted through the measurement terminal 12 to a DCMM. The communication component 68 extracts the information from the internal communication signals and generates internal control signals to carry out the desired action according to the extracted information. For example, in one embodiment the communication component 68 generates internal control signals provided to the processor 52, which in turn configures operation of the multimeter 10 according to the information extracted from the internal communication (i.e., input communication) signals.

In some embodiments of the invention, the information is digitally encoded on the communication signals, and the multimeter 10 and the DCMM 30 are configured to encode and decode the information. Conventional digital encoding and decoded schemes known to those in the art may be utilized in some embodiments of the invention. Additionally, conventional communication protocols known to those ordinarily skilled in the art can be utilized in some embodiments of the invention.

Although FIG. 3 illustrates the previously described blocks separately, in some embodiments, the different blocks can be combined together or a block can perform the functions described for another block. In one embodiment of the invention, an application specific integrated circuit can include multiple ones of the blocks previously described. For example, the processor 52 and memory 54 can be included in an ASIC. In another example, an ASIC includes the processor 52, memory 54, and the communication component 68. In another embodiment, the I/O communication circuit 64 takes advantage of existing circuits in the input circuit 50. For example, the I/O communication circuit 64 utilizes processor controlled current sources, clamp circuit and the like, that are already present in the input circuit and A/D 50. Additionally, although the communication component 68 is shown in FIG. 3 as a separate block, in some embodiments, however, the role of the communication component 68 is performed by the processor 52. For example, the processor can be operable to extract information from the communication signals and generate appropriate internal control signals to perform desired actions according to the communication signal. Additionally, the previously described blocks may be implemented using hardware, software, or a combination of the two.

Figure 4A:
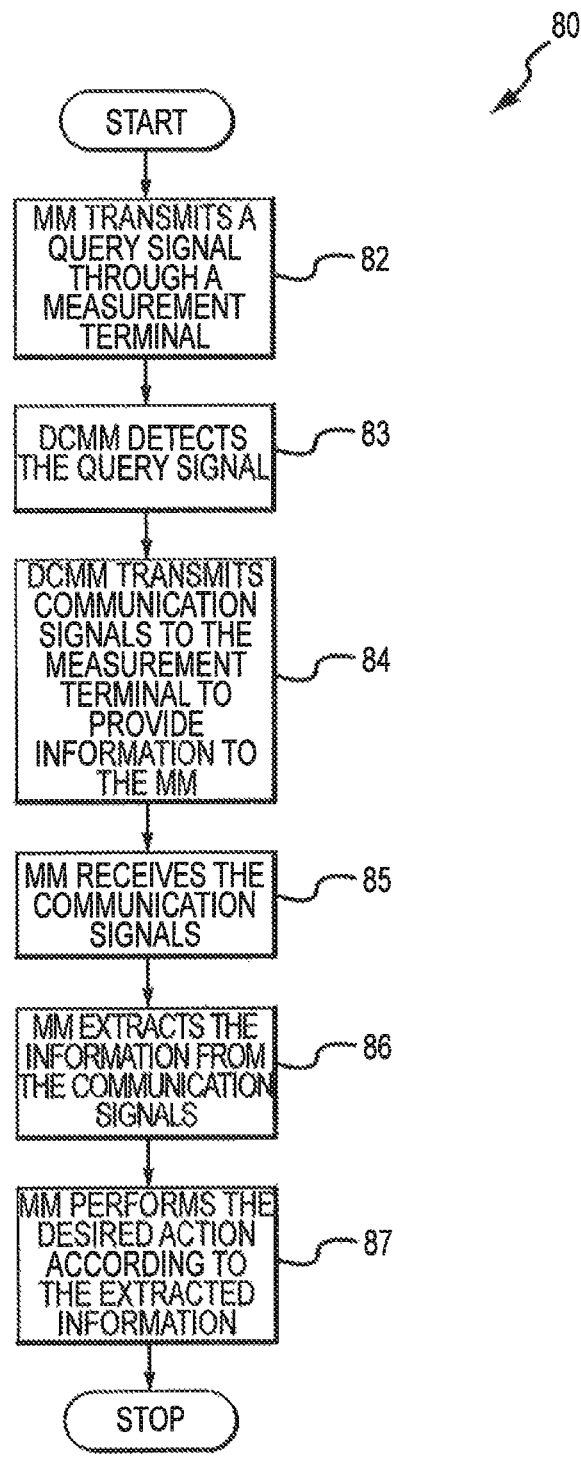
FIGS. 4A and 4B are flow diagrams for communicating in the multimeter communication system according to embodiments of the invention.

FIG. 4A illustrates a communication process 80 according to an embodiment of the present invention for communicating with the multimeter 10. At step 82, the multimeter 10 transmits a query signal through the measurement terminals 12 (FIG. 3) to indicate it is ready for communication. A DCMM 30 coupled to the measurement terminals 12 detects the query signal at step 83 and is notified the multimeter 10 is ready for communication. In some embodiments, the query signal is a digital signal representing a binary code recognizable by the DCMM 30 (FIG. 2). In other embodiments, the query signal is a signal alternating at a specific frequency or having a known amplitude or magnitude detectable by the DCMM 30. Other types of encoding may be used for the query signal as well and the invention is not limited to the particular examples previously described.

As will be described in more detail below, when the DCMM 30 communicates information to the multimeter 10, the DCMM 30 transmits communication signals representing the information to the multimeter 10 by way of the measurement terminals 12 at step 84. The multimeter 10, ready for communication since the transmission of the query signal, receives the communication signals at step 85 and extracts the information from the communication signals at step 86. Following the extraction of information, the multimeter 10 performs the desired action according to the extracted information at step 87.

In some embodiments, the multimeter 10 is set into a communication mode to establish communications between the DCMM 30 and the multimeter 10. In some embodiments, the multimeter 10 is set in the communication mode by user input through the keypad 18 or function selector 20. In other embodiments, the multimeter 10 is set into the communication mode in response to receiving an initial communication signals from a DCMM coupled to the measurement terminals 12. In other embodiments, the multimeter 10 is set into the communication mode upon switching on the multimeter, that is, the multimeter 10 is ready for communication as soon as it is switched on. The examples described are not intended to limit the scope of the invention to the particular embodiments.

Figure 4B:
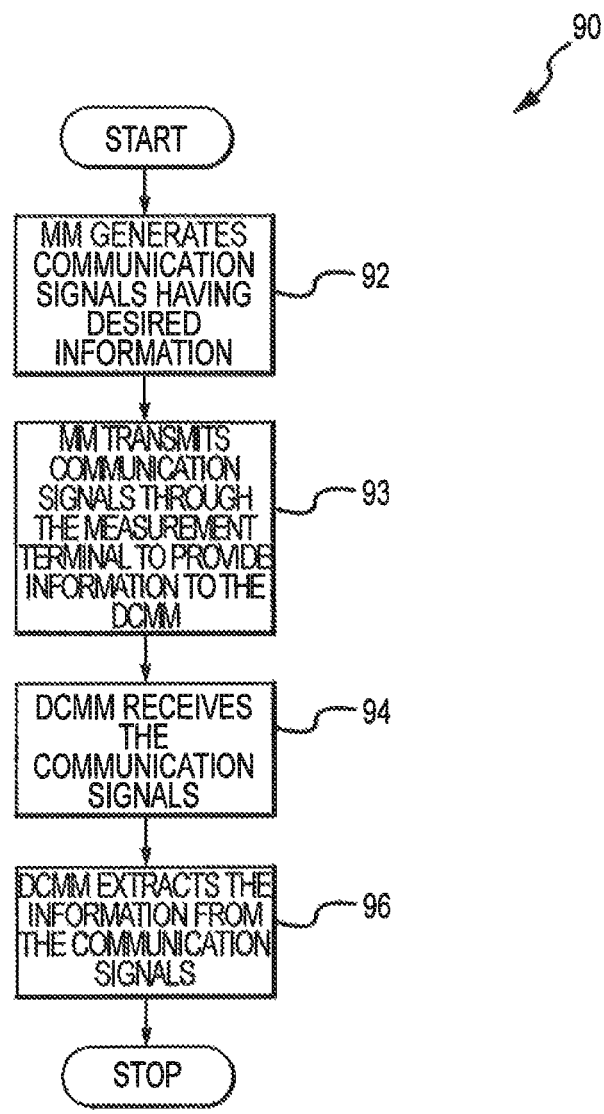

FIG. 4B illustrates a communication process 90 according to an embodiment of the present invention for the multimeter 10 to communicate with the DCMM 30. At step 92, the multimeter 10 generates communication signals having information to be provided to the DCMM 30. At step 93 the multimeter 10 transmits the communication signals having the information to the DCMM 30 by way of the measurement terminals 12. The DCMM 30 receives the communication signals at step 94 and extracts the information from the communication signals at step 96.

Figure 5A:
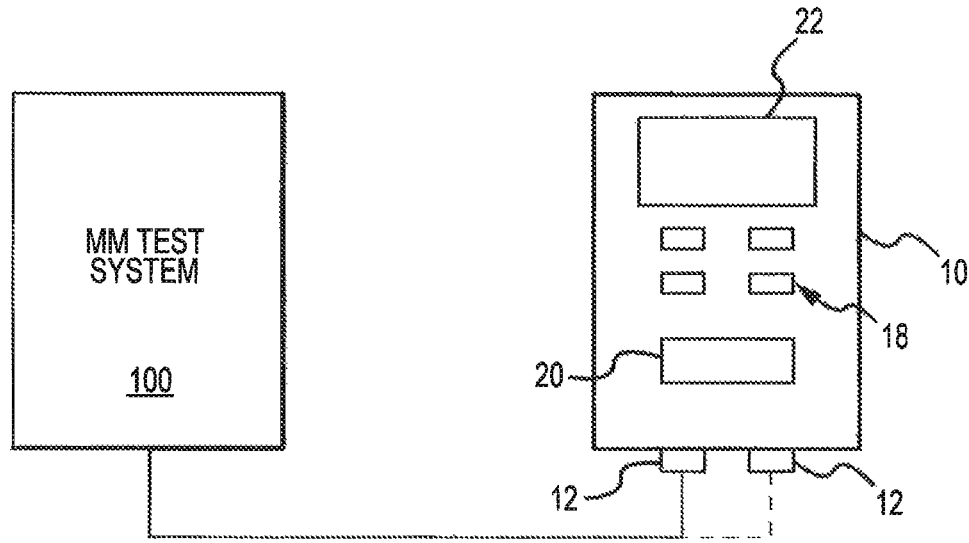
FIGS. 5A-5D are simplified block diagrams of multimeter communication systems according to embodiments of the invention.

In one embodiment, the DCMM 30 represents a multimeter test system 100, as shown in FIG. 5A, coupled to the measurement terminals 12 of the multimeter 10 for testing its functionality and operability. For example, after establishing communication between the test system 100 and the multimeter 10, a test voltage signal having a known voltage can be applied by the test system 100 to the measurement terminals 12 of the multimeter 10. The multimeter 10 conventionally measures the voltage of the test signal and takes the voltage measurement, which may be stored in the memory 54. After the voltage measurement is taken, the value can be encoded in communication signals generated by the multimeter 10 and transmitted to the multimeter test system 100 for comparison against the known voltage value of the test voltage signal applied to the measurement terminals 12. In another embodiment, the multimeter test system 100 transmits communication signals to the multimeter 100 through the measurement terminals 12 to invoke a self-evaluation routine within the multimeter 10 to test operability and functionality of the multimeter system. The results of the self-evaluation (i.e., pass, fail, type of failure) can be encoded in communication signals generated by the multimeter 10 and transmitted to the multimeter test system 100 for evaluation.

Figure 5B:
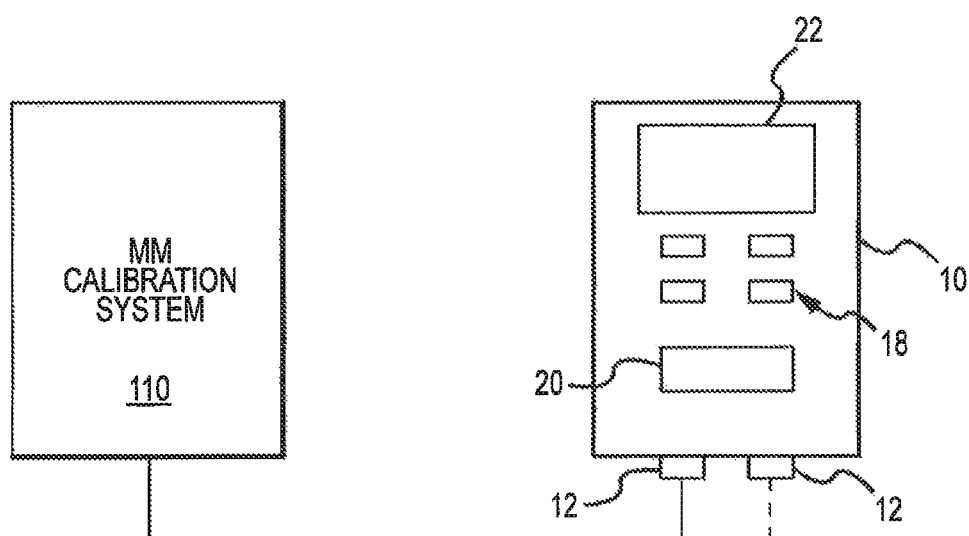

In another embodiment, the DCMM 30 (FIG. 2) represents a multimeter calibration system 110, as shown in FIG. 5B, coupled to the measurement terminals 12 for calibrating the multimeter 10. For example, after communication between the calibration system 110 and the multimeter 10 has been established and the multimeter 10 is placed into a calibration mode, the calibration system 110 can apply known value test signals to the measurement terminals 12 to be measured by the multimeter 10. After completion of the measurement, the multimeter 10 can determine measurement deviation between the known value and the measured value. The multimeter 10 then performs a calibration procedure to calibrate itself to correct for the measurement deviation.

Figure 5C:
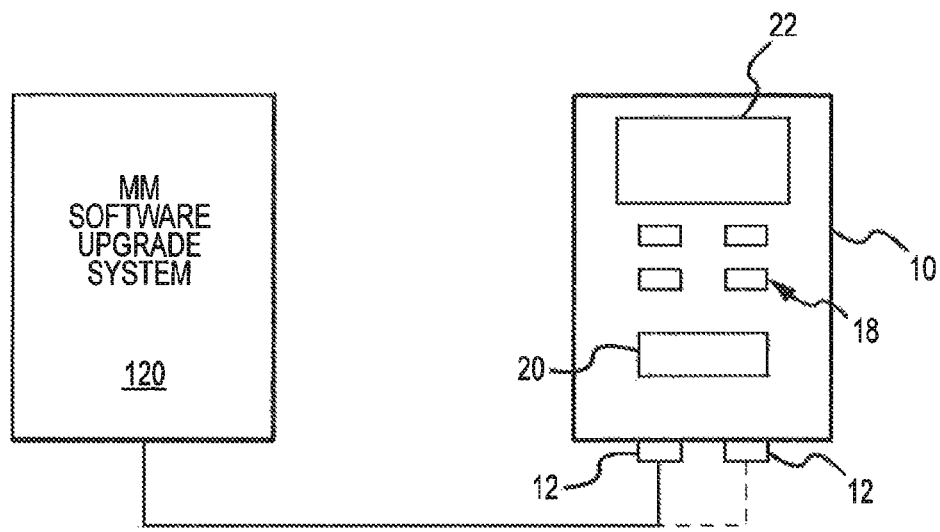
Figure 5D:
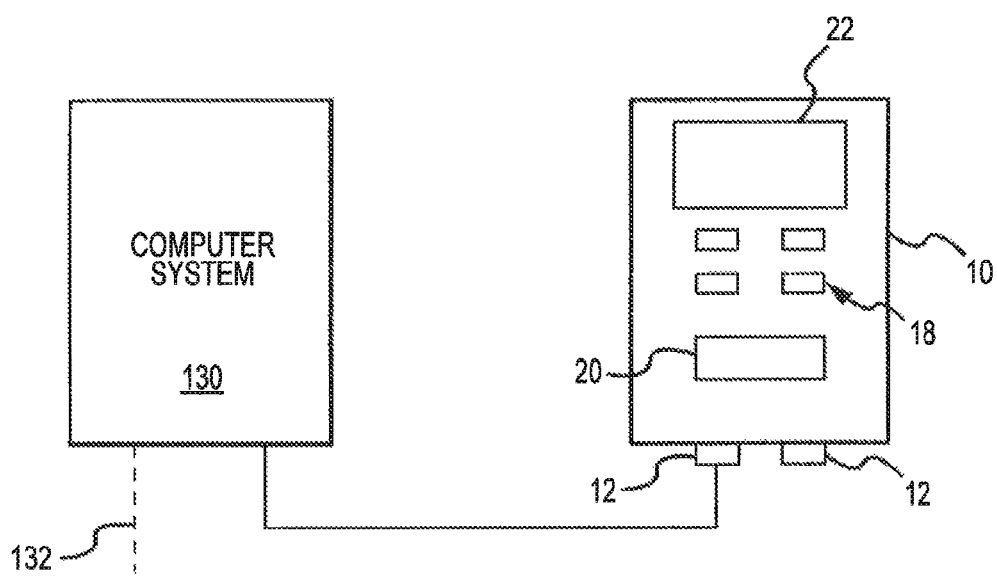

In another embodiment, the DCMM 30 represents a multimeter software upgrade system 120, as shown in FIG. 5C, coupled to the measurement terminals 12 for upgrading the software of the multimeter 10. For example, where a newer version of software for the multimeter 10 is available, the multimeter can be coupled to the software upgrade system 120 through the measurement terminals 12. After communication between the upgrade system 120 and the multimeter 10 is established, the upgrade system 120 transmits communication signals to the measurement terminals 12 of the multimeter 10 which include information for commanding the multimeter 10 to enter an upgrade mode. The software upgrade is transmitted in communication signals to the measurement terminals 12 as well. The multimeter 10 receives the communication signals and installs the software upgrade. In another embodiment, the DCMM 30 represents a computer system 130, as shown in FIG. 5D, coupled to the measurement terminals 12. The computer system 130 can be optionally coupled to a network through network connection 132, which represents wired and wireless network connections. The network to which the computer system 130 is coupled can be a local-area network, wide-area network, the Internet, or other network over which the computer system 130 can communication with other computer systems. The computer system 130 can be used to communicate with the multimeter 10 for a variety of purposes. The computer system 130, for example, can be programmed with failure analysis tools and communicates with the multimeter for the purpose of determining a failure mode of the multimeter 10. In this example, after communication between the computer system 130 and the multimeter 10 is established, the computer system 130 can transmit communication signals to the multimeter 10 having various test routines or evaluation programs that are performed by the multimeter 10. Upon completion of a test, the multimeter 10 can generate communication signals including the results of the testing and transmit the signals through the measurement terminals 12 to the computer system 130. In other examples, the computer system 130 can be appropriately programmed to perform a portion or all of the multimeter testing performed by a multimeter test system, such as that previously described with reference to FIG. 5A. Similarly, the computer system 130 can be programmed to perform calibration or software upgrade of the multimeter 10, as previously discussed with reference to FIGS. 5B and 5C.

More generally, a computer system 130 can be programmed to communicate with the multimeter 10 through the measurement terminals 12, including sending information to the multimeter 10 as well as receiving information from the multimeter 10.

In some embodiments, the multimeter 10, although including components for communicating through the measurement terminals 12, can operate with conventional measurement probes. That is, the multimeter 10 operates and functions as a conventional multimeter when coupled to measurement probes that do not include components for communication through the measurement terminals 12. The difference being that the multimeter 10 will not communicate an information to the measurement terminals 12 to the conventional measurement probe.

In some embodiments of the invention, the multimeter can provide device information to the test system, calibration system, upgrade system, and computer system 130. For example, identification information (e.g., serial number, manufacture date, location of manufacture, etc.), stored in the memory 54, can be encoded in communication signals and transmitted by the multimeter 10 through the measurement terminals 12. Maintenance history stored in the memory 54 is another example of device information that can be provided to the different examples of DCMMs, such as last test date, calibration dates, software upgrade dates, and the like. Upon completion of the testing, calibration, upgrade, or maintenance, the DCMM transmits communication signals having information for updating the maintenance history stored in the memory 54.

Figure 6:
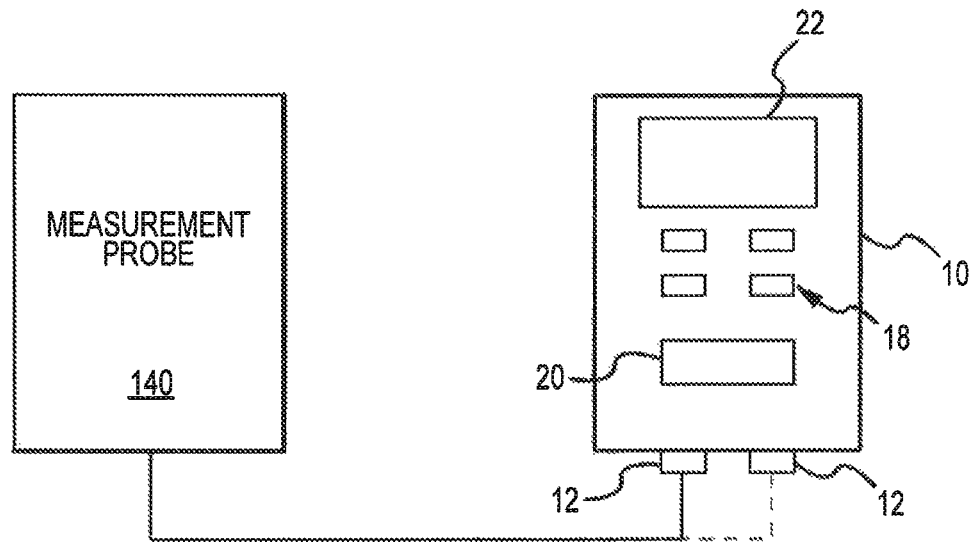
FIG. 6 is a simplified block diagram of a measurement probe and multimeter communication system according to an embodiment of the invention.

In another embodiment, the DCMM 30 represents a measurement probe 140, as shown in FIG. 6, coupled to the measurement terminals 12 of the multimeter 10. Unlike conventional measurement probes, the measurement probe 140 includes circuits and communication components for establishing communication with the multimeter 10, generating communication signals that are transmitted to the multimeter 10 in order to provide it with information, and receiving communications signals from the multimeter 10 and extracting information from the signals.

Figure 7:
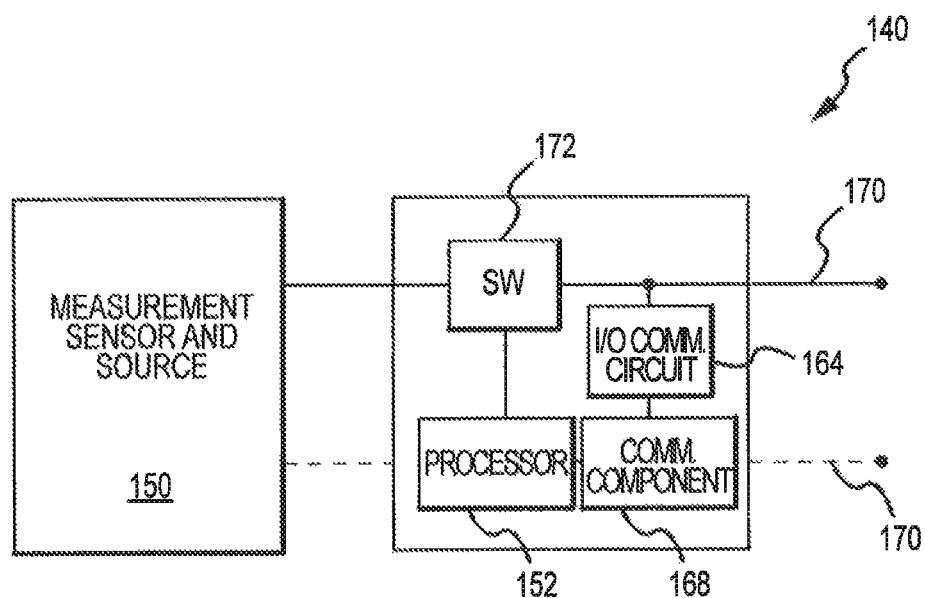
FIG. 7 is a simplified block diagram of a portion of the measurement probe of FIG. 6 according to an embodiment of the invention.

FIG. 7 illustrates a portion of the measurement probe 140 according to an embodiment of the present invention. The measurement probe 140 includes a measurement sensor/source 150 that senses the characteristic to be measured and provides output signals according the measurement. The measurement sensor/source 150 can be conventional. The embodiment of the measurement probe 140 further includes a processor 152, communication component 168 and I/O communication circuit 164 coupled to the probe terminals 170 for generating, providing, and receiving communication signals during communication with the multimeter 10. In another embodiment, the measurement probe 140 may further include a switch circuit 172 controlled by the processor 152 selectively decouple the measurement sensor/source from the probe terminal 170 when transmitting or receiving communication signals from the multimeter 10.

In some embodiments, the communication signals can be alternately sent with a measurement signal. In other embodiments, however, the communication signals is sent encoded in the measurement signal using known signal processing techniques.

The processor 152 determines when and what information should be provided to the multimeter 10 in preparation for sending information to the multimeter 10. The information is provided to the communication component 168 which generates communication signals having the information encoded for transmission. As with the I/O communication circuit 64 of the multimeter 10, the I/O communication circuit 164 receives the communication signals from the communication component 168 and generates output communication signals that are transmitted to the measurement terminals 12 of the multimeter 10. On the receiving side, the I/O communication circuit 164 detects input communication signals from the multimeter 10 and generates corresponding internal communication signals provided to the communication component 168. The communication component 168 extracts information from the internal communication signals and provides the extracted information to the processor 152.

Figure 8:
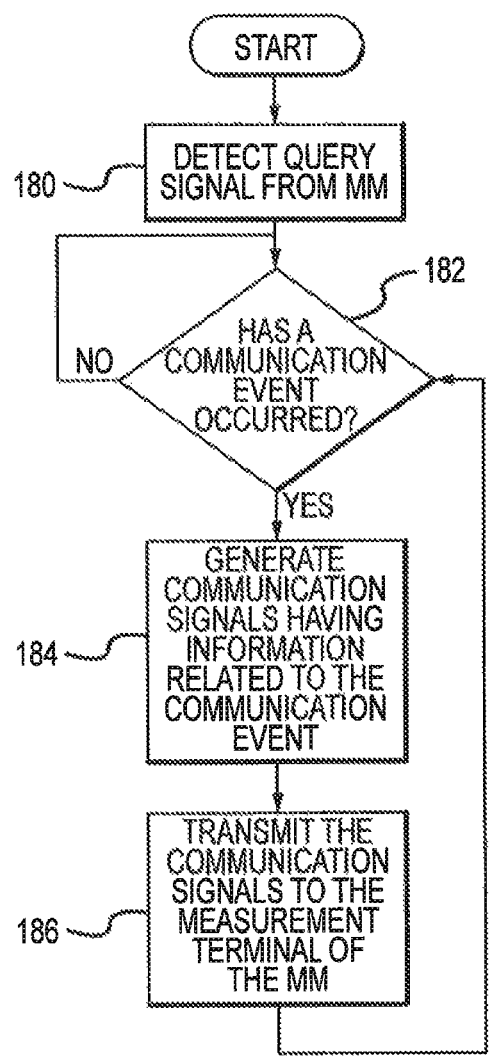
FIG. 8 is a flow diagram for communicating in a measurement probe and multimeter communication system according to an embodiment of the invention.

FIG. 8 illustrates communication from the measurement probe 140 according to an embodiment of the present invention. The I/O communication circuit 164 detects a query signal from the multimeter 10 at step 180. As previously discussed, the multimeter 10 sends out a query signal to establish communication with a DCMM, such as the measurement probe 140. At step 182, the processor 152 determines whether a communication event has occurred. Generally, a communication event is an event that causes the measurement probe 140 to communicate with the multimeter 10. An example of a communication event is switching of a measurement range of the measurement probe 140. In this particular example, the measurement probe can send information to the multimeter 10 to change the presentation of the measurement value on the display 22 so that a user does not need to mentally convert the reading on the display 22 to obtain the correct measurement value, such as with conventional current probes where the reading on the display is in the measurement units of Volts, and the value needs to be mentally converted to the correct magnitude and correct measurement units.

In response to detecting a communication event, the processor 152 prepares the information related to the communication event and the information is provided to the communication component 168 to generate communication signals including the relevant information at step 184. The communication signals are provided to the I/O communication circuit 164, and at step 186, are transmitted to the measurement terminals 12 of the multimeter 10. As previously described, the multimeter 10 receives the communication signals, extracts the information, and performs the desired action according to the extracted information. After the communication signals are provided to the multimeter 10 by the measurement probe 140, the processor 152 returns to step 182 and waits for the occurrence of another communication event to repeat the communication process shown in FIG. 8.

In other embodiments, additional steps are included, such as having the multimeter 10 send communication signals to the measurement probe 140 to indicate acknowledgement of receiving the measurement probe's communication signals and confirming performance of the requested action.

In a particular example, the measurement probe 140 is a current probe. As known, current probes are connected to the measurement terminals of a multimeter and measure current in a conductor. Current probes typically convert a measured current into a proportional voltage that is applied to the measurement terminals of a multimeter. The proportional voltage is displayed on the multimeter in the measurement unit of Volts. Additionally, current probes typically have manually selectable measurement ranges to accommodate the measurement of a wider range of currents. The measured value shown on the display of the multimeter, however, is shown on the same scale for the different current ranges, necessitating a user to convert the displayed value according to the selected measurement range on the current probe to obtain the actual current measurement. As one can imagine, errors can be made in determining the actual current value from the displayed value.

In an embodiment of the invention having a current probe connected to the multimeter, the current probe can provide the multimeter with information to change the display value according to the measurement range selected at the current probe. For example, after communication between the current probe and the multimeter 10 have been established, as previously discussed, a processor in the current probe monitors the status for changes in the selected measurement range (i.e., communication event). Upon detecting a change in the current measurement range, for example, from a 20 A range to a 200 A range, the processor prepares information that is encoded in communication signals by the communication component that include information commanding the multimeter to change the display value according to the change. In the example of changing from the 20 A range to the 200 A range (a factor of 10×), the information in the communication signals includes commands for the multimeter to shift a decimal point in the display one digit to the right to reflect the change in the measurement range.

In another embodiment of the invention, the communication signals can further include information to change the measurement unit displayed by the multimeter. For example, upon connecting the current probe to the multimeter and establishing communication with the multimeter, the processor of the current probe can provide information encoded in communication signals for commanding the multimeter to change from displaying Volts measurement units to Ampere measurement units. In other embodiments of the invention, the communication signals can provide information related to probe functionality and/or operation. For example, the probe can provide communication signals to the multimeter indicating whether the measured electrical characteristic is steady state or alternating so that the multimeter can perform the appropriate calculations and provide an accurate measurement.

It will be appreciated by those ordinarily skilled in the art that other information can be communicated between a measurement probe and a multimeter other than that specifically described above. Consequently, embodiments of the invention should not be limited to the specific examples previously described.

Other examples of measurement probes that may benefit from a communication system according to an embodiment of the invention include thermocouple temperature probes, thermistor temperature probes, pressure sensors, circuit breaker locator probes, CO2 or CO probes, infrared probes, relative humidity probes, probes for locating electrical conductors, and the like. For example, the multimeter can be controlled by communication signals from the probe to change the display to the correct measurement units and/or controlled to display visual information (e.g., graphics) for a user. Communication signals from the probe can also provide information regarding probe configuration and other probe information, for example, probe status, probe functionality, and probe operability. Other types of information not expressly described herein can be communicated between the probe and multimeter as well without departing from the scope of the present invention.

From the foregoing it will be appreciated that, although specific embodiments of the invention have been described herein for purposes of illustration, various modifications may be made without deviating from the spirit and scope of the invention. Accordingly, the invention is not limited except as by the appended claims.

While illustrative embodiments have been illustrated and described, it will be appreciated that various changes can be made therein without departing from the spirit and scope of the invention.

The embodiments of the invention in which an exclusive property or privilege is claimed are defined as follows:

1. A method for communicating with a multimeter, comprising:
    applying measurement signals at measurement terminals of the multimeter;
    generating communication signals representing information to be extracted by the multimeter;
    transmitting the communication signals to the same measurement terminals of the multimeter that were used to apply the measurement signals;
    receiving the communication signals and the measurement signals applied to the measurement terminals in the same input circuit; and
    extracting the information from the communication signals.

2. The method of claim 1, further comprising calculating a measurement value from the measurement signal.

3. The method of claim 1, wherein transmitting the communication signals to the measurement terminals of the multimeter and coupling measurement signals to the measurement terminals are concurrent.

4. The method of claim 1, further comprising generating communication signals representing information to be transmitted by the multimeter from the measurement terminals.

5. The method of claim 4 wherein generating communication signals representing information to be transmitted by the multimeter from the measurement terminals comprises generating communication signals representing at least one of a test measurement value, multimeter identification information, multimeter maintenance information, query information, and self-test information.

6. The method of claim 1 wherein generating communication signals representing information to be extracted by the multimeter comprises encoding digital information on signals to be extracted by the multimeter.

7. The method of claim 1 wherein generating communication signals representing information to be extracted by the multimeter comprises generating signals representing at least one of calibration information, software upgrade information, and measurement range information.

8. The method of claim 1, further comprising calculating a measurement value from the measurement signals and performing an action in accordance with the extracted information.

9. A method for configuring operation of a multimeter, comprising:
    applying measurement signals at measurement terminals of the multimeter;
    generating communication signals encoded with multimeter configuration information to be extracted by the multimeter;
    transmitting the communication signals to the same measurement terminals of the multimeter that were used to apply the measurement signals;
    receiving the communication signals and the measurement signals applied at the measurement terminals in the same input circuit;
    extracting the multimeter configuration information from the communication signals; and
    configuring the multimeter according to the extracted multimeter configuration information.

10. The method of claim 9 wherein generating communication signals encoded with multimeter configuration information comprises generating communication signals encoded with measurement range information and wherein configuring the multimeter according to the extracted multimeter configuration information comprises configuring display of measurement values by the multimeter.

11. A method for communicating with a multimeter, comprising:
    applying measurement signals at measurement terminals of the multimeter;
    applying communication signals at the same measurement terminals of the multimeter; and
    receiving the communication signals and the measurement signals applied to the measurement terminals in the same input circuit.

12. The method of claim 11, further comprising extracting information from the communication signals and performing an action in accordance with the extracted information.

13. The method of claim 11, further comprising calculating a measurement value from the measurement signals.

* * * * *